United States Patent [19]

Bazil

[11] 4,227,095
[45] Oct. 7, 1980

[54] DEVIATION DRIVER CIRCUIT

[75] Inventor: Ralph E. Bazil, Olathe, Kans.

[73] Assignee: King Radio Corporation, Olathe, Kans.

[21] Appl. No.: 921,078

[22] Filed: Jun. 30, 1978

[51] Int. Cl.² ................ G06G 7/12; H03K 1/14
[52] U.S. Cl. .................... 307/229; 307/260; 307/359; 330/85; 330/260
[58] Field of Search ............ 307/262, 264, 229, 230, 307/359, 362, 260; 328/127; 330/85, 260

[56] References Cited

U.S. PATENT DOCUMENTS 3,448,289  6/1969  Harris ................. 330/85 X

Primary Examiner—John Zazworsky
Attorney, Agent, or Firm—Lowe, Kokjer, Kircher, Wharton & Bowman

[57] ABSTRACT

The disclosed deviation driver circuit is capable of producing a difference voltage having a magnitude related to the voltage of a deviation signal provided to the circuit from an external source. The deviation driver circuit of the present invention is comprised of a differential amplifier with negative feedback. This differential amplifier includes a pair of transistors and a plurality of load resistors which are arranged to form a balanced bridged network. Since one input of the differential amplifier is electrically connected to ground, this amplifier generates a difference voltage having a magnitude related to the voltage of the signal provided to the active input of the amplifier. The feedback loop, on the other hand, includes another differential amplifier which is interconnected with the first mentioned differential amplifier to produce a feedback signal having a voltage level related to the magnitude of the difference voltage produced by the first mentioned differential amplifier. The feedback loop also includes a multiple input integrator which is capable of summing the deviation signal and the feedback signal and of integrating the resulting summation signal. The output of the multiple input integrator is electrically coupled with the active input of the first mentioned differential amplifier to close the feedback loop.

10 Claims, 1 Drawing Figure

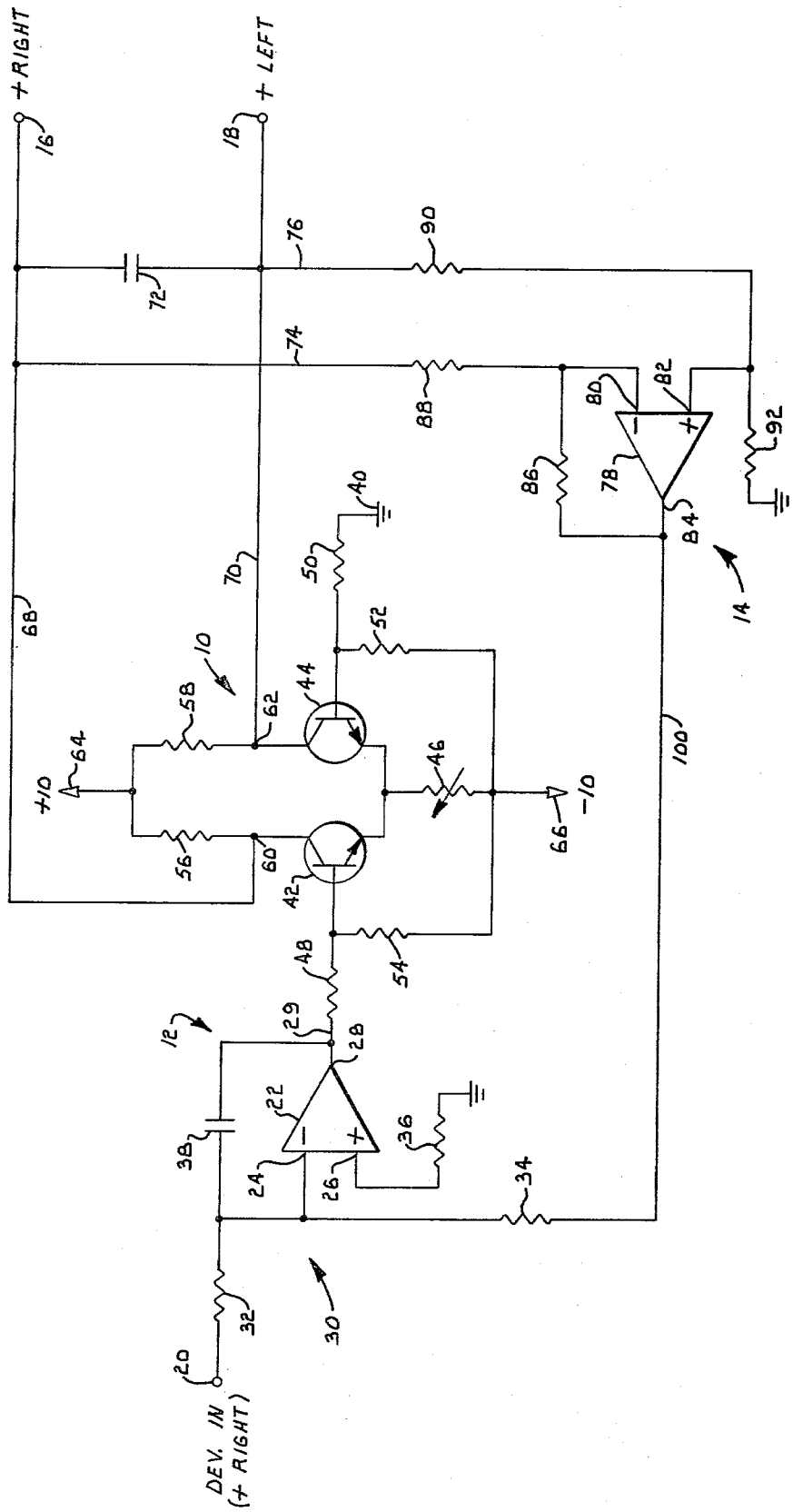

DEVIATION DRIVER CIRCUIT

BACKGROUND AND BRIEF DESCRIPTION OF THE INVENTION

This invention relates in general to a deviation driver circuit which is capable of producing a difference voltage having a magnitude related to the voltage of a deviation signal provided to the circuit from an external source. In particular, the deviation driver circuit of the present invention is comprised of a first differential amplifier to which a second differential amplifier and a multiple input integrator are interconnected to provide negative feedback.

In order to eliminate induced noise and/or ground noise from the difference voltage produced by the deviation driver circuit, it is necessary to have the deviation driver circuit present a large impedance to ground. Transformer coupled signals have been used in the prior art to produce this high impedance to ground. This coupling technique includes rectifying the transformer output signals to provide a DC signal and then driving this DC signal through fairly large resistors. While this coupling technique effectively produces a large impedance to ground, it also increases the differential impedance of the deviation driver circuit. As a result, dummy loads must be utilized to keep the output signal constant and any change in the value of the dummy loads will cause an inaccurate output. Accordingly, the operation of this circuit is continuously monitored in order to insure its accuracy.

It is therefore an object of the present invention to provide a deviation driver circuit which exhibits not only a high impedance to ground to keep induced noise and/or ground noise from appearing in difference voltage produced by this circuit but also a low differential impedance to eliminate the need for dummy loads. The deviation driver circuit of the present invention is comprised of a first differential amplifier having a second differential amplifier and a multiple input integrator coupled with it to form a negative feedback loop. The first differential amplifier provides the high impedance to ground needed to keep induced noise and/or ground noise from appearing in the difference voltage produced by this circuit. The second differential amplifier, on the other hand, is arranged to lower the differential impedance of the deviation driver circuit while the multiple input integrator is provided to maintain the stability of the feedback loop.

Another object of the present invention is to provide a deviation driver circuit which is capable of being connected directly to external equipment without the need for additional coupling circuits.

Another object of the present invention is to provide a deviation driver circuit which is capable of maintaining a positive common mode voltage at its output terminals.

Other and further objects of the invention, together with the features of novelty appurtenant thereto, will appear in the course of the following description of the drawing.

DETAILED DESCRIPTION OF THE INVENTION

The accompanying drawing, which forms a part of the specification and is to be read in conjunction therewith, is a schematic diagram of the deviation driver circuit of the present invention.

Referring now to the FIGURE, the deviation driver circuit of the present invention is comprised of a first differential amplifier 10, a multiple input integrator 12 and a second differential amplifier 14. These components of the deviation driver circuit are interconnected to form a negative feedback loop which is capable of producing at output terminals 16 and 18 a difference voltage having a magnitude related to the voltage of the deviation signal which is provided to the deviation driver circuit at input terminal 20.

The received deviation signal is initially provided to multiple input integrator 12, an operational amplifier 22 having a pair of input terminals 24 and 26 and an output terminal 28, a capacitive feedback element 38 and a plurality of input resistors 32, 34, and 36. Resistors 32 and 34 are interconnected to form a summing network 30 which is electrically coupled with input terminal 24 of operational amplifier 22. Input terminal 26, on the other hand, is electrically connected to ground through resistor 36. The capacitive feedback element is electrically connected to the operational amplifier across output terminal 28 and input terminal 24. In this configuration, operational amplifier 22 operates as an integrator and is capable of generating an output voltage which is proportional to the to the integral of the summation signal provided to input terminal 24.

The output terminal 28 of the operational amplifier 22 is electrically connected to the active input of the first differential amplifier 10 by means of conductor line 29. The other input of this differential amplifier is connected to ground at 40.

As shown in this FIGURE, the first differential amplifier is comprised of a pair of transistors 42 and 44, a variable resistor 46, a plurality of input resistors 48, 50, 52 and 54 and two load resistors 56 and 58. These circuit elements are arranged to form a balanced bridge network. Since the differential amplifier 10 is a balanced bridge network, resistors 48 and 50 are of equal value as are resistors 52 and 54 and resistors 56 and 58. The differential amplifier has a pair of outputs at 60 and 62 and is capable of generating at these output points a difference voltage having a magnitude related to the voltage of the signal provided to the active input of this network via input line 29. The first differential amplifier is also equipped with a plus 10 volt power input at 64 and a minus 10 volt power input at 66. Outputs 60 and 62 are respectively coupled with output terminals 16 and 18 by means of conductor lines 68 and 70. A capacitor 72 is electrically connected between each of these conductor lines to filter the output signal.

The second differential amplifier 14 includes an operational amplifier 78 having an output terminal 84 and a pair of input terminals 80 and 82. This differential amplifier also includes a feedback resistor 86 and a plurality of input resistors 88, 90 and 92. It should be noted at this time that it is preferable to have resistors 86, 88, 90 and 92 be of the same value. If they are equal, the output voltage equals the input voltage times the value of resistor 34 divided by the value of resistor 32. Each input terminal of the operational amplifier is electrically connected to a different output line. In particular, input terminal 80 is electrically connected to output line 68 by means of conductor line 74 and resistor 88 while input terminal 82 is electrically connected with output line 70 by means of conductor line 76 and the voltage divider comprised of input resistors 90 and 92. In this configuration, operational amplifier 78 operates as a differential amplifier which generates at output terminal 84 a feedback signal having a voltage level related to the magnitude of the difference voltage produced by the first differential amplifier. This feedback signal is fed back to the multiple input integrator 12 by means of a conductor line 100 to close the feedback loop.

In operation, the incoming deviation signal is received by the deviation driver circuit of the present invention at input terminal 20. The deviation signal is a DC voltage signal which is generated by an external source not shown in this FIGURE.

The received deviation signal is initially provided to the multiple input integrator 12 where the signal is summed by the summing network with the feedback signal from differential amplifier 14 to provide a summation signal. The summation signal is a current equal to the algebraic sum of the voltage of the deviation signal divided by the resistance of 32 and the voltage of the feedback signal divided by the resistance of 34 and is provided to input terminal 24 of the operational amplifier 22. As discussed above, operational amplifier 22 is arranged to operate as an integrator and, as a result, generates an output signal having a voltage equal to the integral of the summation signal multiplied by a constant. Integration of the summation signal in this manner helps to maintain the stability of the feedback loop even with a large DC loop gain.

The output signal of the integrator circuit is then provided to the active input of the first differential amplifier 10 by means of conductor line 29. The first differential amplifier circuit compares this input signal with ground and produces at outputs 60 and 62 a difference voltage having a magnitude related to the voltage of the input signal. The differential amplifier is arranged to provide the high impedance to ground needed to eliminate induced noise and/or ground noise from the difference voltage at outputs 60 and 62. In addition, variable resistor 46 can be adjusted to provide an emitter resistance capable of maintaining a positive common mode voltage at these outputs. In this way, the deviation driver circuit of the present invention is compatible with equipment having polarized capacitors located at their input terminals.

The difference voltage created across outputs 60 and 62 is transferred to output terminals 16 and 18 via output lines 68 and 70. This difference voltage is also provided to inputs 80 and 82 of operational amplifier 78 by means of conductor lines 74 and 76 respectively. Output line 68 is coupled directly with input terminal 80 by means of input resistor 88 while output line 70 is coupled with input terminal 82 by means of a voltage divider comprised of resistors 90 and 92. The difference voltage present at output terminals 16 and 18 is suitable for use in a number of different operating environments.

To keep the differential impedance of the circuit low, differential amplifier 14 uses the difference voltage present at outputs 60 and 62 to generate a feedback signal having a voltage level related to the magnitude of the difference voltage. The feedback signal is then sent to the multiple input integrator 72 by means of conductor line 100 to close the feedback loop.

For the sake of completely disclosing the deviation driver circuit of the present invention, the following table is provided to show typical values for the various components of the circuit. It should be pointed out, however, that this table is merely illustrative and does not limit the deviation driver circuit of the present invention to any particular embodiment.

| Resistor | Value in Ohms |
| --- | --- |
| 32 | 1 K |
| 34 | 1 K |
| 36 | 510 |
| 46 | 500 |
| 48 | 10 K |
| 50 | 10 K |
| 52 | 2 K |
| 54 | 2 K |
| 56 | 5.1 K |
| 58 | 5.1 K |
| 86 | 10 K |
| 88 | 10 K |
| 90 | 10 K |
| 92 | 10 K |
| Capacitor | Value in Microforads |
| 38 | .1 |
| 72 | 40 |

From the foregoing, it will be seen that this invention is one well adapted to attain all ends and objects hereinabove set forth together with the other advantages which are obvious and which are inherent to the structure.

It will be understood that certain features and subcombinations are of utility and may be employed without reference to other features and subcombinations. This is contemplated by and is within the scope of the claims.

Since many possible embodiments may be made of the invention without departing from the scope thereof, it is to be understood that all matter herein set forth or shown in the accompanying drawing is to be interpreted as illustrative and not in a limiting sense.

Having thus described my invention, I claim:

1. A deviation driver circuit for producing a difference voltage having a magnitude related to the voltage of a DC deviation signal which is generated by an external source, said deviation driver circuit comprising:

a first differential amplifier producing said difference voltage in response to an input signal, said difference voltage having a magnitude related to the voltage of said input signal; and a feedback loop coupled with said first differential amplifier, said feedback loop being comprised of means for producing a feedback signal having a voltage level related to the magnitude of said difference voltage and multiple input integrating means for summing said feedback signal with said deviation signal to provide a summation signal having a current level related to the algebraic sum of the voltage of said deviation signal and for integrating said summation signal to provide said input signal, wherein said means for producing a feedback signal being further comprised of a second differential amplifier operable to produce a feedback signal having a voltage level related to the magnitude of said difference voltage, said second differential amplifier having a first and a second input and a single output, said second differential amplifier being coupled with said first differential amplifier so that said difference voltage is provided to the first and second inputs of said differential amplifier.

2. The circuit as in claim 1, wherein said first differential amplifier includes a first and a second output across which said difference voltage is provided.

3. The invention as in claim 2, wherein said second differential amplifier is comprised of an operational amplifier having a first and a second input and a single output, a feedback resistor connected between the output of said operational amplifier and the first input of said operational amplifier, a first input resistor electrically coupled with the first output of said first differential amplifier and with the first input of said operational amplifier, a second input resistor electrically coupled with the second output of said first differential amplifier and with the second input of said operational amplifier and a third input resistor electrically coupled with the second input of said operational amplifier and with ground.

4. The circuit as in claim 1, wherein said multiple input integrating means is comprised of an operational amplifier having a first and a second input and a single output, a capacitor feedback element connected between the output of said operational amplifier and one input of said operational amplifier and first and second input resistors electrically coupled with said one input of said operational amplifier so as to form a summing network, said summing network being arranged to receive and sum said deviation signal and said feedback signal to produce said summation signal, said operational amplifier also having its output electrically coupled with said first differential amplifier so as to provide said input signal to said first differential amplifier.

5. A deviation driver circuit for producing a difference voltage having a magnitude related to the voltage of a DC deviation signal which is generated by an external source, said deviation drivers circuit comprising:
a first differential amplifier for producing said difference voltage in response to an input signal, said difference voltage having a magnitude related to the voltage of said input signal;
a second differential amplifier means for producing a feedback signal having a voltage level related to the magnitude of said difference voltage; and
a multiple input integrating means for summing said feedback signal with said deviation signal to provide a summation signal having a current level related to the algebraic sum of the voltage of said feedback signal and the voltage of said deviation signal and for integrating said summation signal to provide said input signal.

6. The circuit as in claim 5 wherein said first differential amplifier means includes a first and a second output across which said difference voltage amplifier is provided.

7. The invention as in claim 6 wherein said second differential amplifier means is comprised of an operational amplifier having a first and a second input and a single output, a feedback resistor connected between the output of said operational amplifier and the first input of said operational amplifier, a first input resistor electrically coupled with the first output of said first differential amplifier means and with the first input of said operational amplifier, a second input resistor electrically coupled with the second output of said first operational amplifier and a third input resistor electrically coupled with the second input of said operational amplifier and with ground.

8. The invention as in claim 5, wherein said multiple input integrating means is comprised of an operational amplifier having a first and a second input and a single output, a capacitive feedback element connected between the output of said operational amplifier and one input of said operational amplifier and first and second input resistors electrically coupled with said one input of said operational amplifier so as to form a summing network, said summing network being arranged to receive and sum said deviation signal and said feedback signal to provide said summation signal, said operational amplifier also having its output electrically coupled with said first differential amplifier so as to provide said input signal to said first differential amplifier.

9. A deviation driver circuit for producing at least one voltage signal having a voltage level related to the voltage of a DC deviation signal which is generated by an external source, said deviation driver circuit comprising:
a first differential amplifier operable to produce said voltage signal in response to an input signal, said voltage signal having a voltage level related to the voltage of said input signal; and
a feedback loop coupled with said first differential amplifier, said feedback loop being comprised of means for producing a feedback signal having a voltage level related to the voltage of said voltage signal and multiple input integrating means for summing said feedback signal with said deviation signal to provide a summation signal having a current level related to the algebraic sum of the voltage of said feedback signal and the voltage of said deviation signal and for integrating said summation signal to provide said input signal, said multiple input integrating means having an operational amplifier having a first and a second input and a single output, a capacitive feedback element connected between the output of said operational amplifier and one input of said operational amplifier and first and second input resistors electrically coupled with said one input of said operational amplifier so as to form a summing network, said summing network being arranged to receive and sum said deviation signal and said feedback signal to produce said summation signal, said operational amplifier also having its output electrically coupled with said first differential amplifier so as to provide said input signal to said first differential amplifier.

10. A deviation driver circuit for producing at least one voltage signal having a voltage level related to the voltage of a DC deviation signal which is generated by an external source, said deviation driver circuit comprising:
a first differential amplifier means for producing said voltage signal in response to an input signal, said voltage signal having a voltage level related to the voltage of said input signal;
a second differential amplifier means for producing a feedback signal and having a voltage level related to the voltage of said voltage signal; and
a multiple input integrating means for summing said feedback signal with said deviation signal to provide a summation signal having a current level related to the algebraic sum of the voltage of said feedback signal and the voltage of said deviation signal and for integrating said summation signal to provide said input signal.

* * * * *